(12) United States Patent
Knaipp

(10) Patent No.: US 8,129,782 B2
(45) Date of Patent: Mar. 6, 2012

(54) HIGH-VOLTAGE TRANSISTOR AND METHOD FOR ITS MANUFACTURE

(75) Inventor: Martin Knaipp, Unterpremstätten (AT)

(73) Assignee: austriamicrosystems AG, Unterpremstätten (AT)

( * ) Notice: Subject to any disclaimer, the term of this patent is extended or adjusted under 35 U.S.C. 154(b) by 604 days.

(21) Appl. No.: 11/992,172

(22) PCT Filed: Sep. 20, 2005

(86) PCT No.: PCT/EP2005/010138
§ 371 (c)(1),
(2), (4) Date: May 11, 2009

(87) PCT Pub. No.: WO2007/033692
PCT Pub. Date: Mar. 29, 2007

(65) Prior Publication Data
US 2009/0212360 A1   Aug. 27, 2009

(51) Int. Cl.
*H01L 29/66* (2006.01)
*H01L 21/336* (2006.01)
(52) U.S. Cl. ........................ 257/339; 438/301
(58) Field of Classification Search .................. 438/228, 438/276, 289, 301; 257/339, 407
See application file for complete search history.

(56) References Cited

U.S. PATENT DOCUMENTS

| | | | |
|---|---|---|---|
| 4,290,077 A | 9/1981 | Ronen et al. | |
| 5,907,173 A | 5/1999 | Kwon et al. | |
| 6,455,893 B1 * | 9/2002 | Gehrmann et al. | 257/339 |
| 6,677,210 B1 * | 1/2004 | Hebert | 438/301 |
| 2002/0005550 A1 | 1/2002 | Takahashi et al. | |

FOREIGN PATENT DOCUMENTS

| | | |
|---|---|---|
| DE | 103 25 011 | 1/2005 |
| DE | 10 2004 014 928 | 10/2005 |
| WO | WO 2006/015822 | 2/2006 |

OTHER PUBLICATIONS

I-S Yang et al., "An Improvement of SOA on n-channel SOI LDMOS Transistors", Proceedings of the 10$^{th}$ International Symposium on Power Semiconductor Devices & ICS, pp. 379-382, Jun. 3, 1998.
A. Nezar et al., "A submicron B1-CMOS-DMOS process for 20-30 and 50v applications", Proceedings of the 1997 International Symposium on Power Semiconductor Devices and ICS, pp. 333-336, May 26, 1997.

* cited by examiner

*Primary Examiner* — Calvin Lee
(74) *Attorney, Agent, or Firm* — Cozen O'Connor

(57) ABSTRACT

A high-voltage transistor is provided with a well of a first conductivity type, which is arranged in a substrate (10) of a second conductivity type, with a source (14), a drain (12), and a gate electrode (18) above a channel region (KN, KP) formed between the source and the drain, wherein several staggered and nested wells (11, 13, 15, 17) of the same conductivity type extend from the source (14) or the drain (12) into the substrate (10) and wherein the doping concentration (log c) of the wells essentially decreases and is smoothed from the substrate surface with increasing depth (T) and also laterally. In this way, field-strength increases and also unintentional breakdown are prevented. Furthermore, a production method is specified.

8 Claims, 12 Drawing Sheets

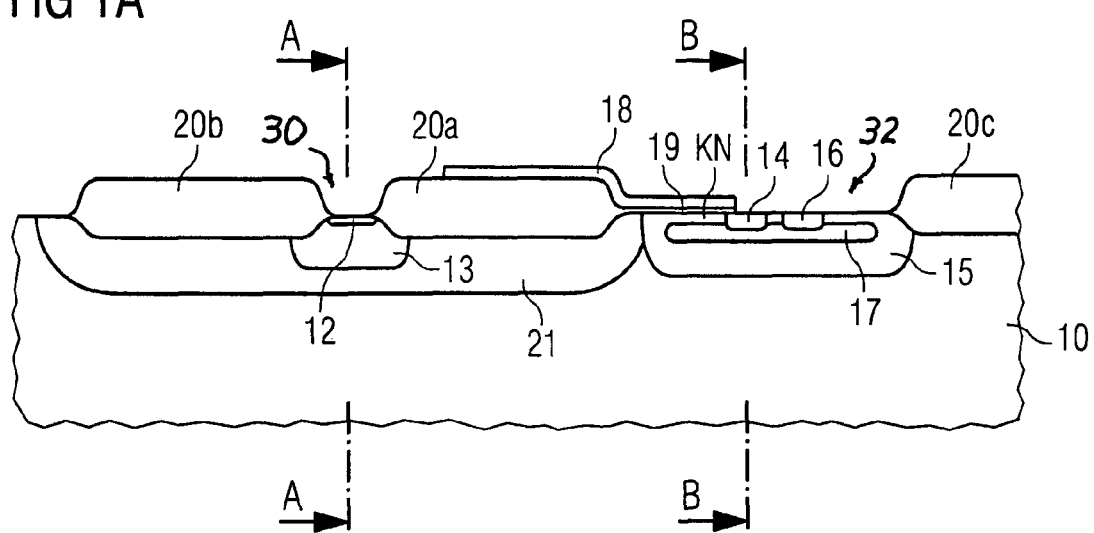
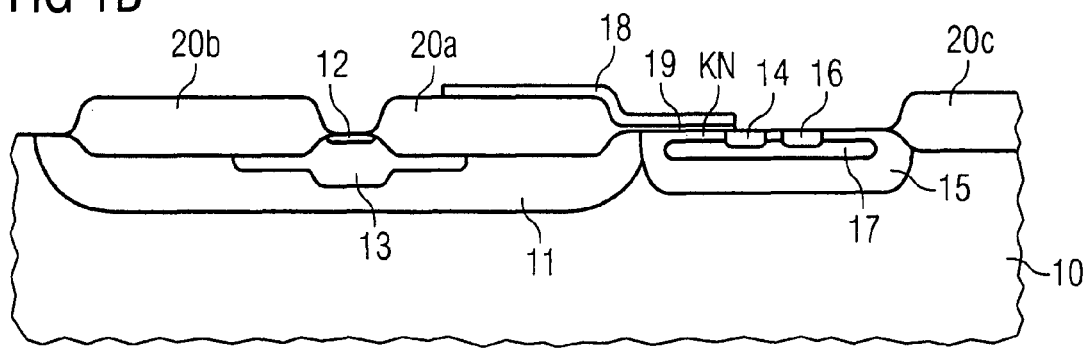

HIGH-VOLTAGE TRANSISTOR AND METHOD FOR ITS MANUFACTURE

RELATED APPLICATIONS

This is a U.S. national stage of application No. PCT/EP2005/010138, filed on 20 Sep. 2005.

FIELD OF THE INVENTION

The invention relates to a high-voltage transistor with a well of a first conductivity type, which is arranged in a substrate of a second conductivity type, with a source, a drain, and a gate electrode above the channel region formed between the source and drain. Furthermore, the invention relates to a method for its production and a method for the common production of a high-voltage transistor and a low-voltage transistor.

BACKGROUND OF THE INVENTION

The known production of high-voltage transistors (field-effect transistors) in integrated circuits regularly leads to optimized transistors for the desired voltage range. This can extend from more than 10 V up to 150 V and beyond. Typical use is automotive technology, in which, in addition to logical circuit elements, switches for the battery-voltage levels and for controlling spikes must also be provided. These high-voltage transistors can be fabricated, in principle, with processes such as those for CMOS circuits with operating conditions of 3.3 V or 5 V. This fabrication, however, is complicated and expensive, because a plurality of additional masks and processing steps are necessary and/or a large space required for the high-voltage transistor result.

Vertical high-voltage transistors are often generated with the aid of an epitaxial layer, whose thickness and concentration must be optimized for the desired voltage range. The layer thicknesses that are used can reach 10 μm or above, which can be realized only with a very complicated epitaxial deposition. The necessary buried layer, its doping and contact through the epitaxial layer (sinker) require several special processing steps necessary for the high-voltage transistor. In order to optimize the transistor surface area, i.e., its lateral extent, the thickness of the epitaxial layer must be adapted to the desired voltage level.

The attempt to produce high-voltage transistors as lateral transistors in connection with a low-voltage process for logic transistors leads to other difficulties. For example, the electrical field strengths are controlled so that at the positions of greatest field-strength concentration, breakdown does not occur, which could lead to malfunctions or to the destruction of the integrated circuit. Normally, this requirement leads to a large spatial requirement for the high-voltage transistors and thus to high chip costs.

From U.S. Pat. No. 6,455,893 B1, a lateral high-voltage transistor is known which requires less space because the electrical field strength occurring on the highly doped drain is reduced by means of a lower doped drain extension and a field plate. The described transistor can also be used for CMOS processes with less than a 1-μm structure width. However, the document asserts that the dielectric strength of the transistor is limited because the retrograde implantation profile in the edge regions of the drain extension leads to a less suitable doping pattern.

From U.S. Pat. No. 6,677,210 B1, another HV transistor is known, which has a drift region, within which the concentration of the majority charge carriers continuously increases through a combination of different doped wells toward the drain region in the lateral direction.

SUMMARY OF THE INVENTION

One object of the invention is to provide an improved lateral high-voltage transistor and a production method for a submicron technology, which relate to a production process for low-voltage transistors.

This and other objects are attained in accordance with one aspect of the invention directed to a high-voltage transistor, comprising several staggered wells of the same conductivity type that extend starting from the source or the drain to the substrate, so that the doping concentration of the wells essentially decreases with increasing depth and has a smoothed profile. Staggered, in this context, means that the lowest lying well has the greatest lateral extent and that, in this lowest-lying well, the next highest well of the same conductivity type is embedded. In the latter well, in turn, if necessary, another well of the same conductivity type is embedded or else equals the p+ or n+ regions for the source or drain for the PMOS or NMOS transistors. Smoothed, in this context, means approaching the ideal of a linear decrease of doping concentration with increased depth.

The next well adjacent to the source or drain is less doped than the source or drain, likewise each adjacent deeper and wider well is less doped than each higher and narrower well, wherein finally the lowest lying well is the least doped.

It is advantageous when the well directly adjacent to the source region or the drain region is constructed as a shallow well.

When the previously named shallow well is produced as a retrograde well, the maximum dopant concentration is not at the well surface but lies deeper.

Through thermal steps, which are inevitably necessary for the production of the integrated circuit, the dopants of the staggered wells diffuse out. In this way, large dopant differences are equalized, which then leads in the vertical and also lateral direction to a more uniform concentration profile of the dopants and thus to a more uniform field distribution of the operating voltage applied to the transistor. The uniform field distribution ensures a maximum breakdown voltage, because breakdowns occur only at positions with high potential gradients and these do not appear in the transistor according to the invention.

For the invention, one can speak of a technological concept for a voltage-scalable lateral high-voltage transistor or high-voltage process. Here, the provided range of the operating voltage finally determines not only the lateral dimensions as a whole, but also the number of staggered wells. With merely four wells, a deep n-well and p-well and a shallow n-well and p-well respectively embedded in these deep wells, in addition to low-voltage transistors of both channel types, it is also possible to produce high-voltage transistors of both channel types.

It is advantageous according to the invention that lithographic masks and wells can be reused in different applications for other transistor types or equivalent wells can be produced for different component types with the same step and thus can be fabricated together in the same mask step. The low number of lithographic masks is a decisive factor, in order to reduce the processing steps, to increase the quality of the product to be produced and to reduce costs. Therefore, the acceptance of the described high-voltage process is increased.

BRIEF DESCRIPTION OF THE DRAWINGS

Below, the invention is explained in more detail with reference to embodiments and the associated figures. The figures and the parameter information are used just for illustrating the invention and are therefore shown only schematically and not true to scale. For the sake of better clarity, boundary regions of all of the described wells are shown with continuous lines; but it is understood that there are no sharp boundaries. Identical or identically acting elements are provided with the same reference symbols. Shown are:

FIGS. 1A to 1B show schematic cross section through a high-voltage transistor according to an embodiment of the invention with an n-channel.

DETAILED DESCRIPTION OF THE DRAWINGS

Figure 2A:
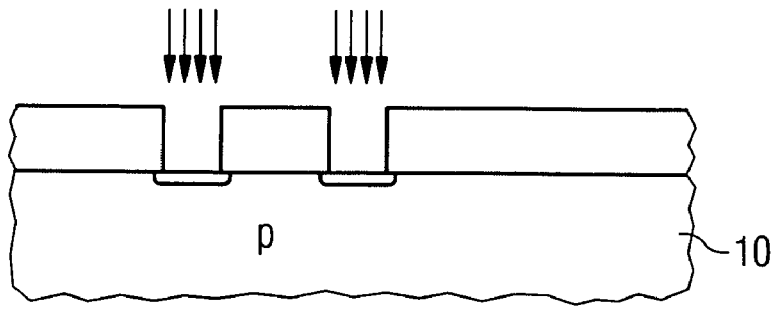
FIGS. 2A to 2F show selected processing steps in the production of the high-voltage transistor of FIGS. 1A to 1B in schematic cross section, FIG. 3 a schematic cross section through a high-voltage transistor with a p-channel according to an embodiment of the invention.

The embodiments relate to a 0.35 μm CMOS technology, as is known for low-voltage arrangements. This transistor technology requires, in contrast to processing technologies with larger structures, a relatively high surface concentration for the transistor elements.

According to FIG. 1A, an n-doped well 21 is arranged in a p-doped substrate 10 doped, e.g., with boron. The n-well 21 is at a medium depth and extends underneath a field-oxide region 20a and 20b. In the embodiment, the n-well extends laterally past the field-oxide region on both sides thereof. The n-well corresponds to the n-well of the low-voltage process and can be produced with the same mask as the latter.

The field-oxide region 20a and 20b is interrupted by a first window 30, in which the drain diffusion 12 lies as a highly doped n-conductive region of typically high dopant concentration of ca. $10^{20}$ cm$^{-3}$. Underneath the drain diffusion 12 there is a shallow n-doped well 13 (SN well), which is less doped than the drain diffusion 12.

The boron-doped substrate typically has a concentration of ca. 3 to $9*10^{14}$ cm$^{-3}$. The n-well 21 is typically generated with phosphorus as the dopant and a dosage of ca. $10^{13}$ cm$^{-2}$ through implantation with the energy of ca. 300 keV. With a long thermal drive-in step, e.g., of more than 180 min and especially more than 200 min at more than 1050° C., the depth of the pn-junction to the substrate is set at approximately 3 μm underneath the field oxide 20 and 20b. Through the long diffusion out, a relatively low volume concentration of the n-well 21 is produced. However, it is also possible to drive in an additional n-well even deeper, e.g., at a temperature of more than 1100° for more than 600 min. This produces a so-called DN well. This well then sees the greatest thermal budget and must therefore be driven in as the first well in the process flow. In addition, it then also sees the thermal processes of all of the other wells generated later.

The shallow n-well 13 is typically realized as a retrograde well with phosphorus as the dopant and an energy of ca. 500 keV, as well as a dosage of ca. $5*10^{12}$ cm$^{-2}$. The protected region under the silicon surface is approximately 0.5 μm deep. The dopant is driven in for a short time, i.e., e.g., less than 50 min at less than 1050° C. In principle, arsenic is possible as another n-conductive dopant. In the shallow n-well, the local concentration of dopant exceeds that of the deep n-well.

In a second window 32 between the field oxide 20a and the field oxide 20c, the source region 14 is arranged as a highly doped, n-conductive region of typical concentration of ca. $10^{20}$ cm$^{-3}$. The source region 14 lies in a deep p-doped well 15 (DP well), which connects to the substrate 10. A shallow p-well 17 (SP well) is embedded into DP well 15. In addition to the source region 14, a highly doped region 16 with p-conductivity is also arranged, which reaches, like the source, from the surface of the substrate into the shallow p-well 17 and is provided for contacting the substrate.

The deep p-well 15 is typically generated with boron as a dopant and a concentration of ca. $10^{13}$ cm$^{-3}$ through implantation with ca. 300 keV. Then follows a medium-length thermal drive-in step, e.g., of more than 100 min at more than 1100° C. The shallow p-well 17 is typically constructed as a retrograde well with boron and an energy of below 150 keV, as well as a concentration of ca. $10^{13}$ cm$^{-3}$. A short drive-in step with the described conditions is performed. The p-well region 17 ends ca. 0.5 μm under the silicon surface.

As well as being arranged on a gate oxide 19, which extends from the source region 14 up to the field oxide 20a in the direction toward the drain connection 12, the gate electrode 18 is arranged on a part of the adjacent field oxide 20a. In the region between the source region 14 and field oxide 20a, the gate electrode 18 forms the gate, under which the re-channel KN of the high-voltage transistor is located in the p-well 15 or 17. Above the field oxide 20a, the gate electrode 18 acts as a field plate and is used for controlling the electric field in the drift section of the n-well 21, which is located under the field oxide. The gate electrode comprises a polysilicon layer, with which, in very high-voltage transistors, a metal layer arranged at a distance above this polysilicon layer and used as a field plate is connected in an electrically conductive way (see, e.g., FIG. 5).

The n-well 21 and the shallow n-well 13 act in their region underneath the field oxide as a drain extension and as a drift section for the charge carriers from the channel region. The electric field is controlled with the field plate, here in the lateral direction between the source and drain. The length of the drift section from the n-well 21 and the shallow n-well 13 is adapted to the desired operating voltage of the transistor.

Figure 9:
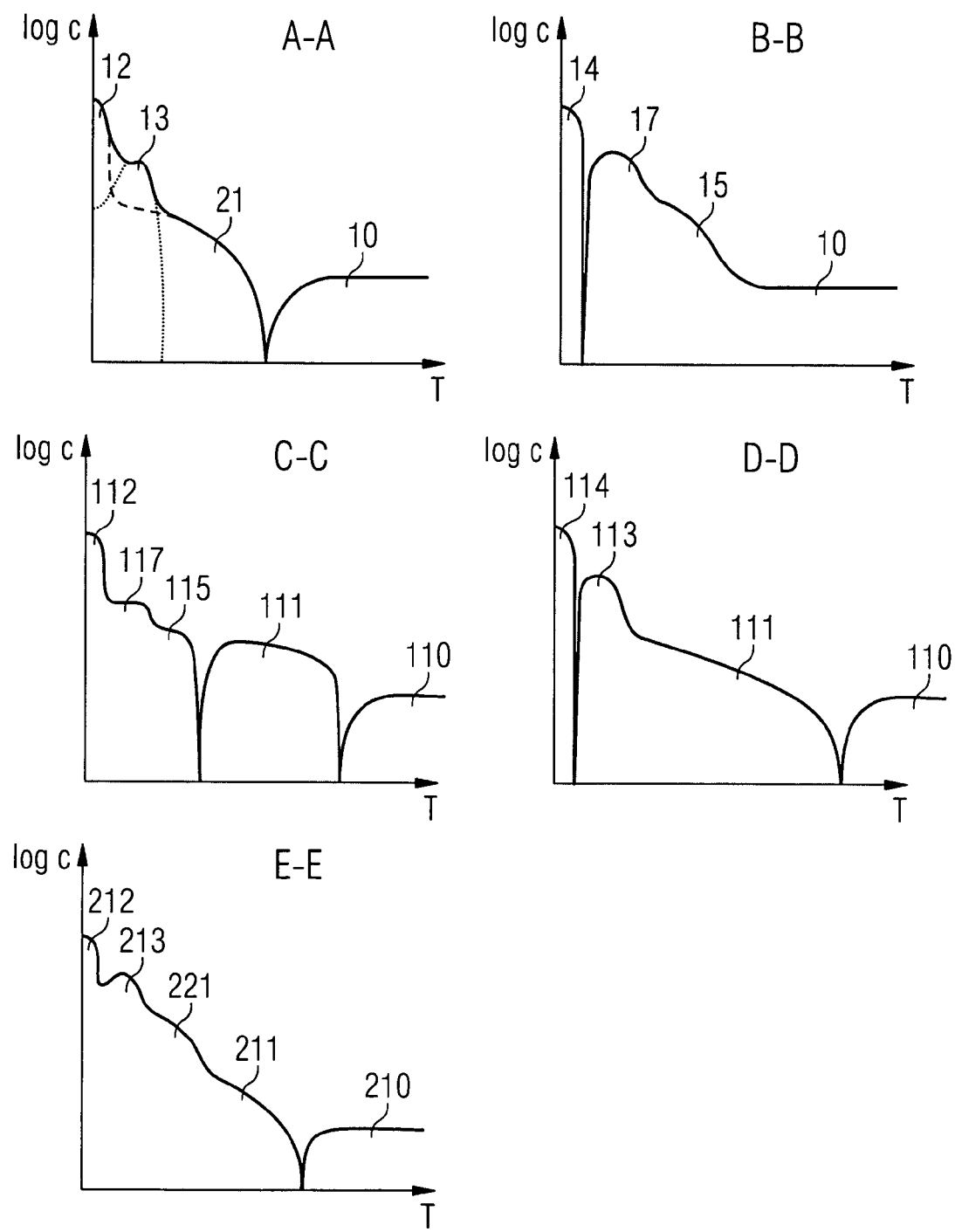
FIG. 9 shows doping profiles for a high-voltage transistor according to an embodiment of the invention from FIGS. 1A, 1B, 3, and 5 along the section lines illustrated there.

In the vertical direction, i.e., from the substrate surface of the drain connection 12 or the source region 14 in the direction toward the substrate, the effect of each deep and shallow well is made clear from FIG. 9. FIG. 9 shows the dependence of the doping concentration, specified as a logarithmic value, on the depth T of the substrate. As becomes clear from FIG. 9 for the section identified by A-A in FIG. 1A, the shallow n-well 13 has the effect that the doping concentration is increased considerably in the junction region from the drain 12 to the n-well 21, which is indicated by dashed lines, with the aid of the shallow n-well 13, which is indicated by dotted lines. Ideally, the decrease of the doping concentration, e.g., from the drain 12 to the border between n-well 21 and the substrate 10, is linear. As can be seen from the graph A-A of FIG. 9, the dotted line portion departs substantially from such linearity. However, if n-well 13 has the appropriate doping, than a more linear decrease is achieved, as shown by the solid line. Thus, a smoothed profile of the doping concentration of the drain 12 to the n-well 21 is produced. Additionally, a smoothed profile of the electric field strength is produced based on the doping concentration and the shape of the well. Sharp edges of the well and a rapid decrease of the doping concentration must be avoided to prevent an electrical breakthrough. Also, in the lateral direction, the shallow n-well 13 contributes to smoothing the electric field strength (adaptive RESURF or adaptive REduced SURface Field).

In a similar way, the shallow p-well 17 underneath the source region 14 allows the deep p-well 15 to be less doped than without the well 17, so that the p-concentration of the wells 17 and 15 is smoothed to the substrate 10, see FIG. 9, for the section identified by B-B in FIG. 1A. The transistor shown is suitable, e.g., for use up to 50 V.

FIG. 1B shows a variant in which the shallow n-well 13 has a stepped profile, in contrast to the uniform doping according to FIG. 1A, and extends farther below the field-oxide regions 20a and 20b than in FIG. 1A. The medium-depth n-well 21 is here replaced with a deep n-well 11. The drift region is formed by the deep n-well 11 and the shallow n-well 13.

FIGS. 2A-2F show, using cutouts, selected processing steps with reference to corresponding schematic sections through the transistor. In FIG. 2A, the implantation for producing the n-doped well 21 (N well) is shown. A resist mask directly on the p-doped substrate 10 covers areas not to be exposed to implantation. The mask is structured into a preferably regular pattern of openings, which form, for example, a strip pattern, in the area to be doped. In the figure, two openings of the resist mask are shown. Implanted regions initially separated from each other are generated accordingly. The implantation can here be performed as oblique implantation. Here, the substrate can be rotated during implantation or between two implantation steps by a rotational angle of, e.g., 90°. Additional rotations and additional implantation steps can follow. With these measures, shadowing effects of the resist mask can be used with their regular pattern of openings, in order to implant different effective dosages according to the mask pattern. For example, they can be implanted with a common implantation method in different regions at different effective dosages. The rotation of the substrate is also used for optimizing the homogeneity of the doping within a mask opening.

Figure 2B:
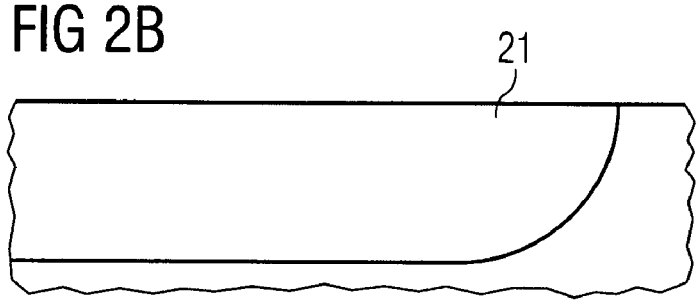

After the implantation, the drive-in is performed by means of a suitable temperature budget for widened and deeper wells. Here, the previously separated implanted regions grow together to form a single, coherent doped region of the n-well 21, which has a uniform doping strength. Elevation lines of the doping profile running parallel to the substrate surface are also produced. FIG. 2B shows the n-doped well 21 after the removal of the resist mask.

Figure 2C:
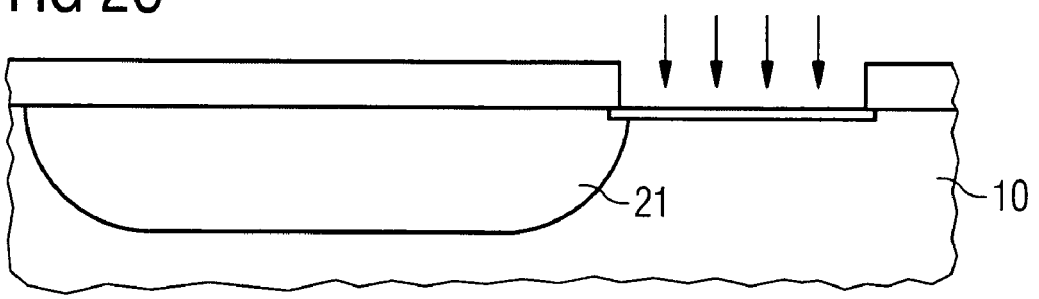
Figure 2D:
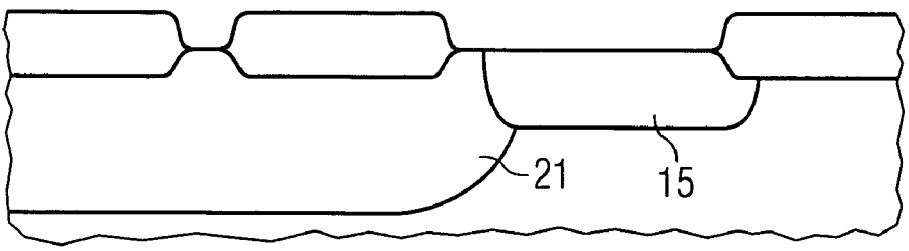

FIG. 2C shows the implantation of the deep p-doped well 15 by means of another resist mask. Due to its smaller lateral extent, a single opening in the resist mask is suitable here. Then the mask is removed and then field-oxide regions 20a-20c are generated by means of local oxidation. The driving-in of the doping is then performed, wherein the deep p-doped well 15 increases up to its desired lateral and vertical extents.

Figure 2E:
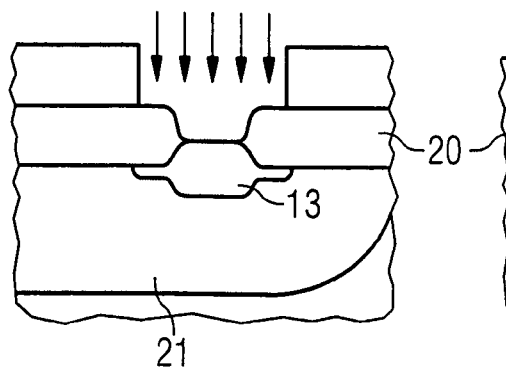
Figure 2F:
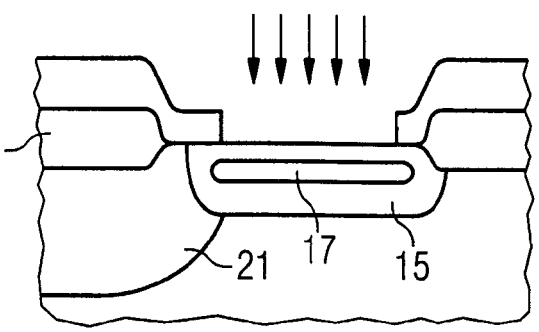

With additional resist masks, openings for the implantation of dopant for the shallow n-well 13 (FIG. 2E) and the shallow p-well 17 (FIG. 2F) are generated and the corresponding dosage is implanted. In FIG. 2E, the resist mask has a greater opening than the field-oxide regions lying underneath, so that the projecting ends of the field-oxide regions lead to partial shadowing, which expresses itself in the overall step-shaped profile shown in the figure for the shallow n-well 13 due to the lower penetration depth or implanted dosage. The completed transistor with this profile is also shown in FIG. 1B. For the shallow p-well 17 (FIG. 2F), no corresponding profile is generated here.

Figure 3:
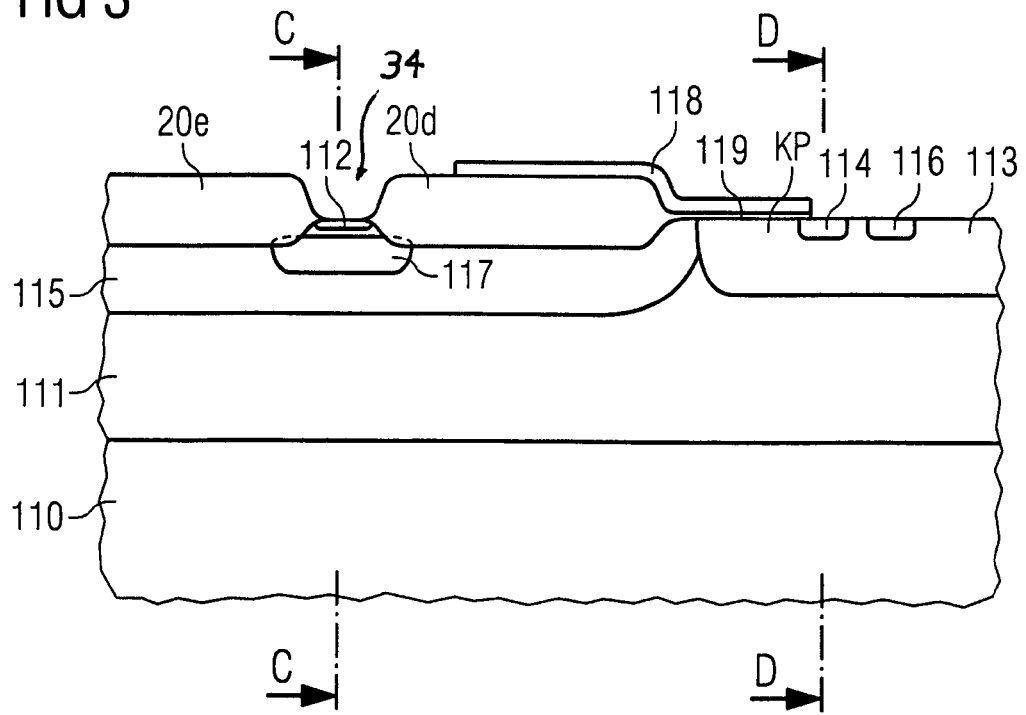

FIG. 3 shows a high-voltage transistor with p-channel. Relative to FIG. 1, corresponding functional regions are designated with reference numbers increased by a hundred without consideration of the doping type. Above the substrate 110 there is a deep n-well 111 (DN well), which lies underneath the source and drain regions and insulates these from the substrate. For this reason, the n-doped region 116 cannot be connected to the substrate. Therefore, the channel can have a higher potential than the substrate, in contrast to the uninsulated transistors without an insulating well. Thus, this insulated transistor can be operated like a PMOS and switched to the uppermost potential. The deep n-well 111 is typically generated with phosphorus as the dopant and a dosage of ca. $10^{13}$ cm$^{-2}$ through implantation ca. 300 keV. With a long thermal drive-in step, as described, the depth of the pn-junction to the substrate is set at approximately 6 μm. In the deep n-well 111, there is the shallow n-well 113 (SN well), which holds the highly p-doped source region 114. In addition, there is the highly n-doped region 116. The deep p-doped well 115, which extends underneath the field-oxide region 20d, 20e, connects to the shallow n-well 113 in the lateral direction. In the window 34 of the field oxide is the highly p-doped drain 112, underneath which a shallow p-well 117 is implanted into the p-well 115. The wells are produced together with the corresponding wells of the same conductivity type from FIG. 1, because they can be produced under the same conditions and thus in the same step.

As in FIG. 1, a polysilicon gate electrode 118 is arranged above the p-channel region KP and insulated from it by a gate oxide 119. The gate electrode extends as a field plate up to the gate oxide 20d. The thickness of the gate oxide can be selected in this and in other embodiments as a function of the desired dielectric strength, wherein dielectric strengths of, e.g., a maximum of 3.3 V, 5.5 V, and 20 V relative to the source lying at 0 V can be realized.

The concentration profile in the vertical direction to the substrate surface is shown for the drain connection 112 and the source region 114 with reference to FIG. 9, profiles C-C and D-D in a corresponding scaling. Profile C-C is for the section identified by C-C in FIG. 3 through the drain region, and D-D is for the section identified by D-D in FIG. 3 through the source region, wherein the corresponding regions and wells are designated. As can be seen, the double-well arrangement underneath the drain leads to a smoothing of the concentration profile of the doping.

Figure 4A:
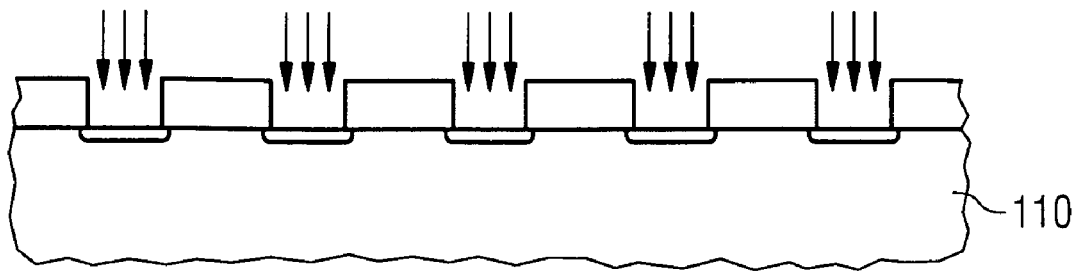
FIGS. 4A to 4F show selected processing steps for the production of the high-voltage transistor of FIG. 3.
Figure 4B:
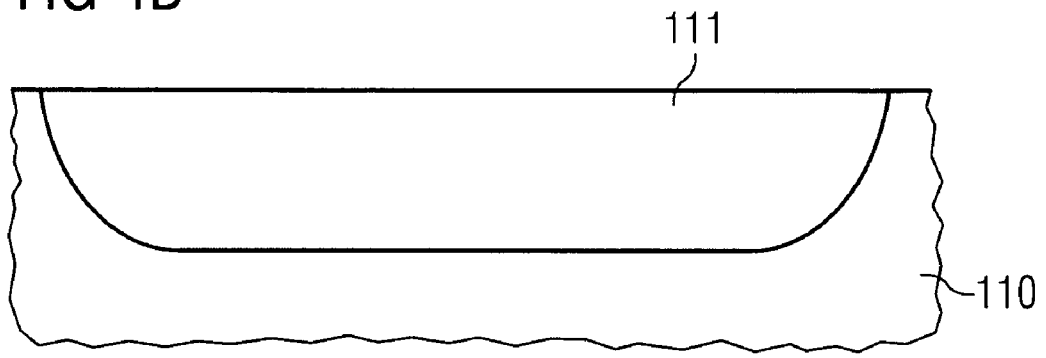

In FIGS. 4A-4F, selected processing steps are shown in the production of the high-voltage transistor with the p-channel described in FIG. 3. FIG. 4A shows the implantation of the deep n-well 111, which, as shown and described in FIG. 2A, is realized by means of a resist mask with a pattern, e.g., of strip-shaped openings. In this way, the already described advantages are achieved. Due to the greater lateral extent of the deep n-well 111, there is a larger number of openings here.

Figure 4C:
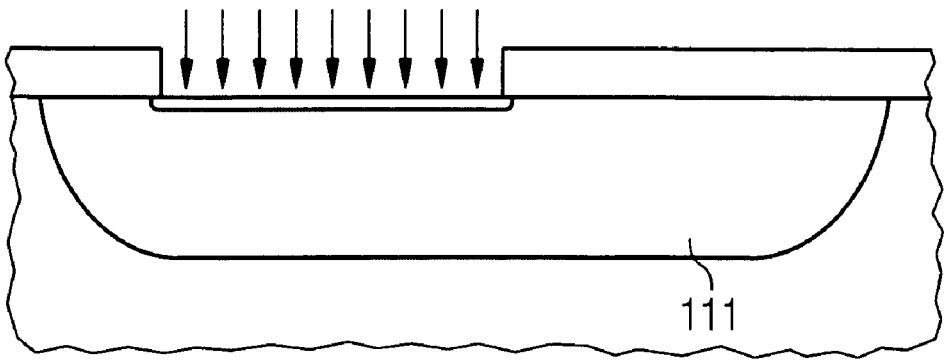
Figure 4D:
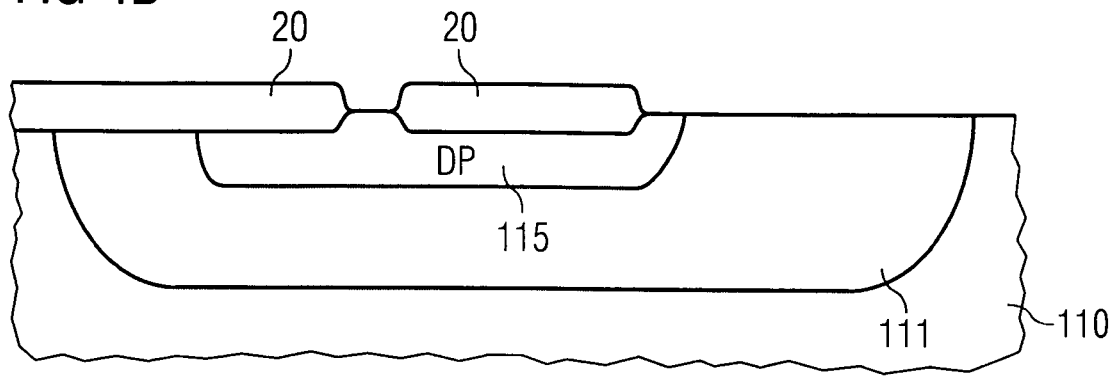
Figure 4E:
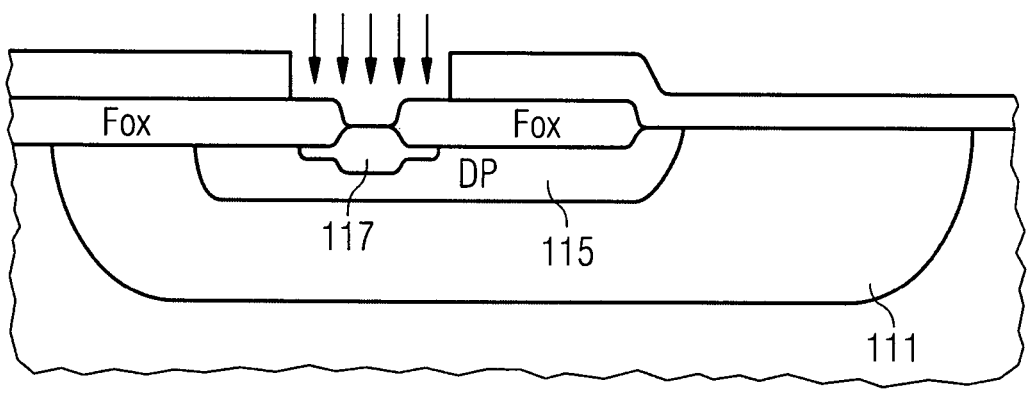
Figure 4F:
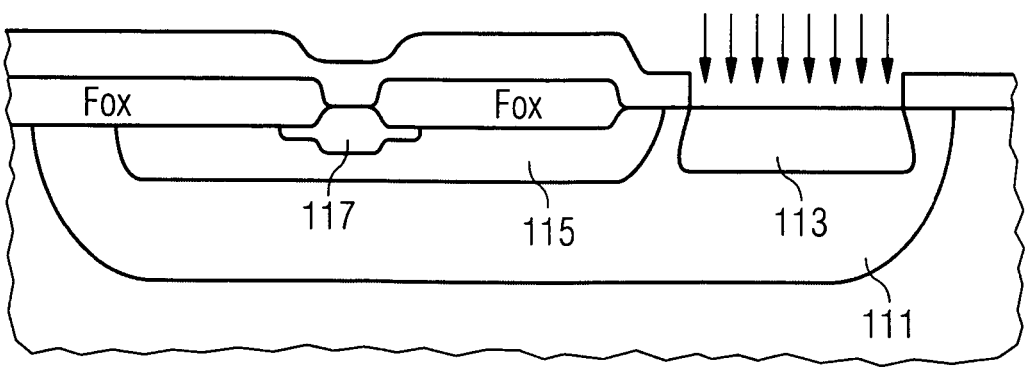

An especially uniform doping of the deep n-well is realized, which is shown in FIG. 4A after the drive-in and the removal of the resist mask. Next, the implantation is performed for the deep p-well 115, which is performed again by means of a resist mask and is shown in FIG. 4C. FIG. 4D shows the arrangement after the drive-in of the deep p-well 115 and after the generation of the field-oxide regions 20. The implantation of the shallow p-well 117 is performed primarily in a region between two field-oxide regions, wherein a resist mask is again used. Field-oxide branches projecting into the mask opening provide for a stepped doping profile through stronger shadowing of the implantation. With another resist mask, in addition to the deep p-well 115, a shallow n-well 113 is implanted (FIG. 4F) and driven in.

Figure 5:
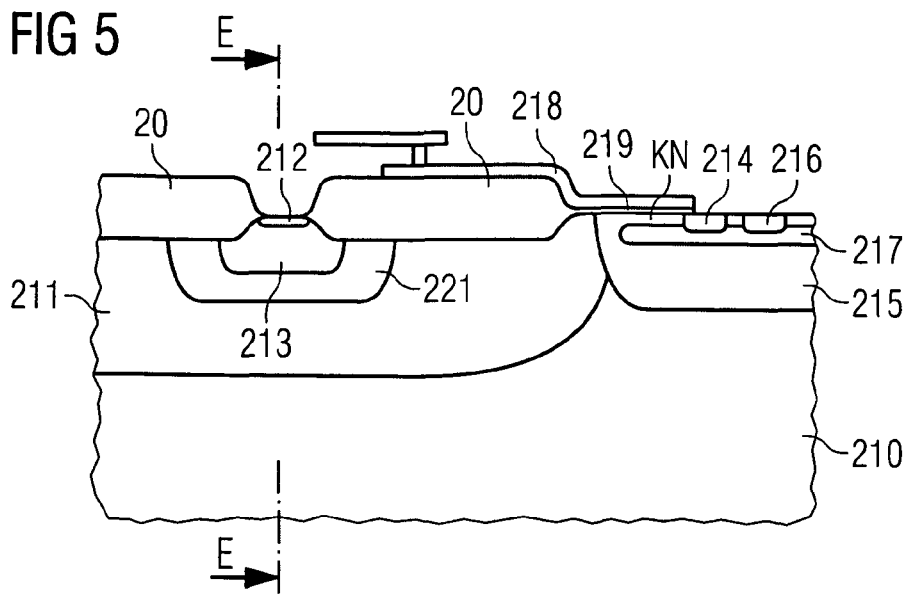
FIG. 5 shows a schematic cross section through a high-voltage transistor according to an embodiment of the invention with an n-channel and increased dielectric strength.

FIG. 5 shows, with reference to a very high-voltage n-channel transistor, how the concept of the multiple wells is expandable for embedding each source and drain in transistors for even higher voltages, e.g., for voltages up to 150 V. For reducing the high electric field strengths on the drain in a simple way, an n-well 221 (N well) is arranged between the deep n-well 211 and the shallow n-well 213 of the n-channel transistor. In this way, the concentration and thus field-strength reduction can be further smoothed perpendicular and parallel to the substrate surface, and a field-strength increase in the vertical and lateral directions can be prevented. Incidentally, in FIG. 5, elements corresponding to those in FIG. 1 are characterized by the addition of two hundred, i.e., element 2*xy* of FIG. 3 corresponds to element *xy* of FIG. 1. FIG. 9 shows the corresponding concentration profile underneath the drain region as a function of the substrate depth with reference to the cross-sectional profile E-E.

As is clear from the embodiment of FIG. 5, the basic concept of the invention, namely, arranging several differently doped wells under the drain and the source connection, can scale and be applied to arrangements for different voltage requirements. In this way, additional advantageous embodiments can be developed with processing steps provided from the low-voltage process. For example, the embodiment according to FIG. 5 can be completely insulated from the substrate, if only the deep n-well 211 also extends under the deep p-well 215 and embeds this p-well. Also suitable for this construction is the basic low-voltage process, wherein correspondingly shaped masks must be produced. For example, in the high-voltage transistor according to FIG. 5, the width of the field-oxide regions 20 is increased from, e.g., 4 µm, as in the example from FIG. 1 or 3, to 10 µm, by means of which significantly higher breakdown voltages can be achieved.

Figure 6A:
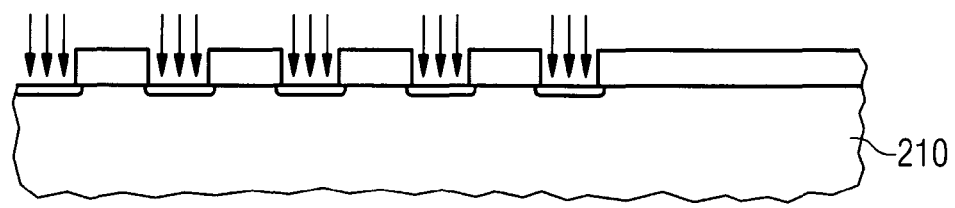
FIGS. 6A to 6D show selected processing steps in the production of the high-voltage transistor of FIG. 5.
Figure 6B:
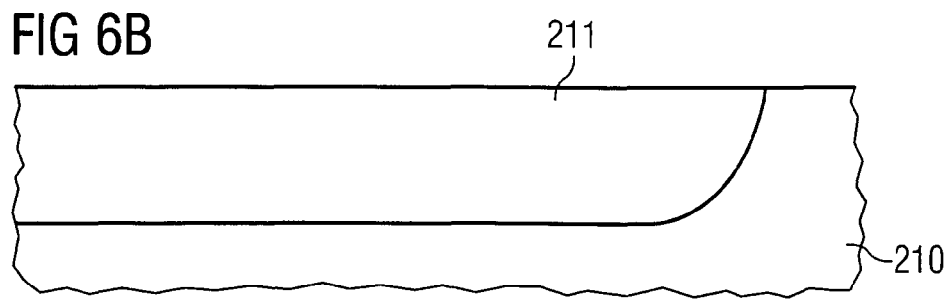
Figure 6C:
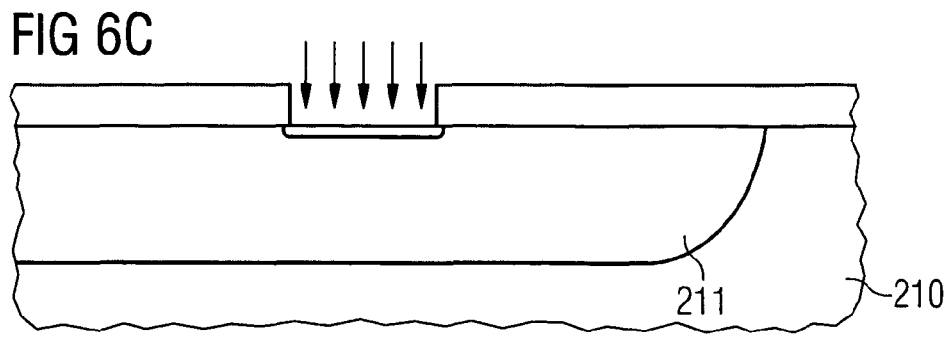
Figure 6D:
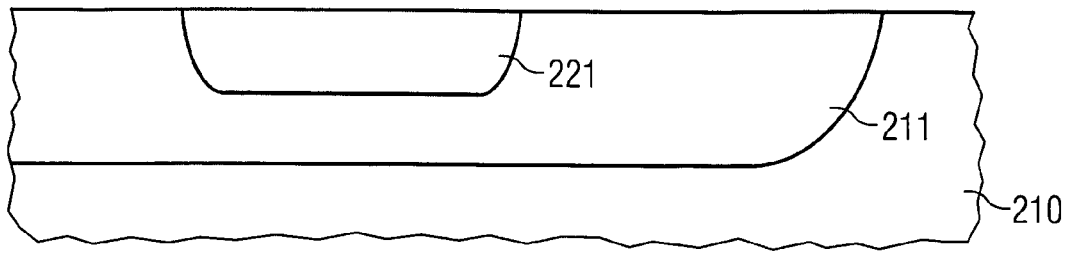

FIGS. 6A-6D show, using cutouts, selected processing steps in the production of the high-voltage transistor of FIG. 5 with reference to corresponding schematic sections through the transistor. In FIG. 6A, the implantation for the deep n-well 211 is shown with a resist mask provided in the region of the well to be generated with a pattern of openings. Due to the larger lateral extent of the deep n-well, several openings are provided in the resist mask, as in FIG. 2A. In FIG. 6B, the originally separately implanted regions grow together to form a deep n-well 211 with a uniform doping. FIG. 6C shows the implantation step for generating the n-well 221 (N well) shown in FIG. 6D. The implantation for each transistor is performed by means of a single opening in the resist mask at a dosage of $5*10^{12}$ to $1*10^{13}$ cm$^{-2}$. The drive-in phase is performed, for example, at a temperature below 1150° C. for less than 250 min. A penetration depth of ca. 3 µm is produced for the well shown in FIG. 6D. Then, the generation of a deep p-well 215, field-oxide regions 220, and a shallow n-well 213 and a shallow p-well 217 follow the processing steps already described with reference to FIGS. 2C-2F.

Figure 7:
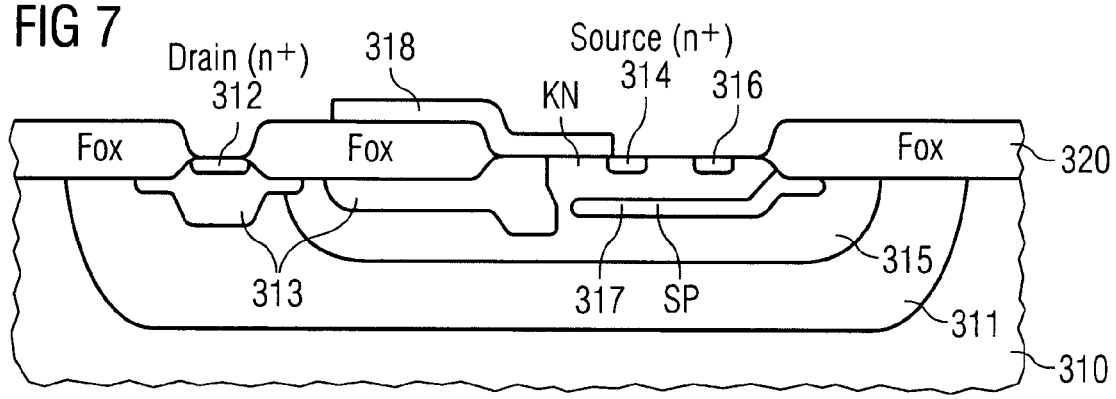
FIG. 7 shows a schematic cross section through a high-voltage transistor according to an embodiment of the invention with an n-channel and insulation against the substrate.

FIG. 7 shows, using cutouts, a schematic cross section through a high-voltage transistor with n-channel, which is completely embedded in a deep n-well 311 and is thus insulated from the p-doped substrate 310 by a semiconductor junction. The drain 312 is embedded in a shallow n-well 313. The source is embedded in a shallow p-well 317 and this deep p-well 315. The deep p-well 315 extends up under the drift region and is compensated there by the shallow n-well. The n-channel KN is formed directly under the gate 318 in the region of the deep and shallow p-well 315/317. The gate oxide is not also shown.

Figure 8A:
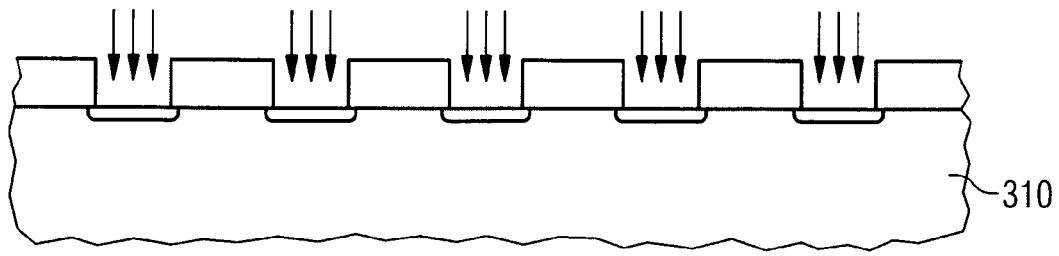
FIGS. 8A-8F show selected processing steps in the production of the high-voltage transistor of FIG. 7.
Figure 8B:
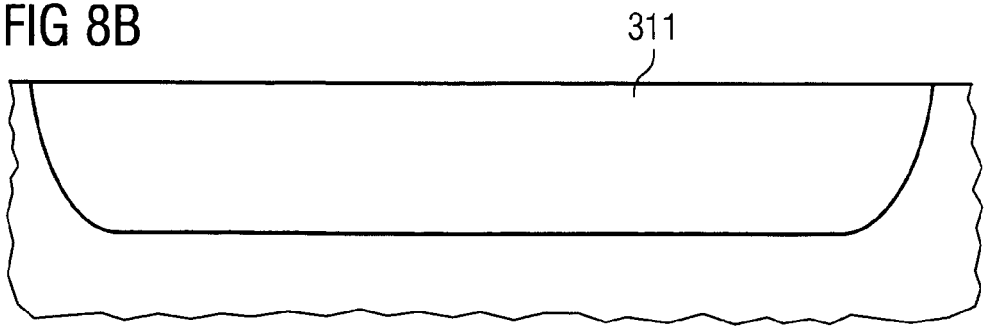
Figure 8C:
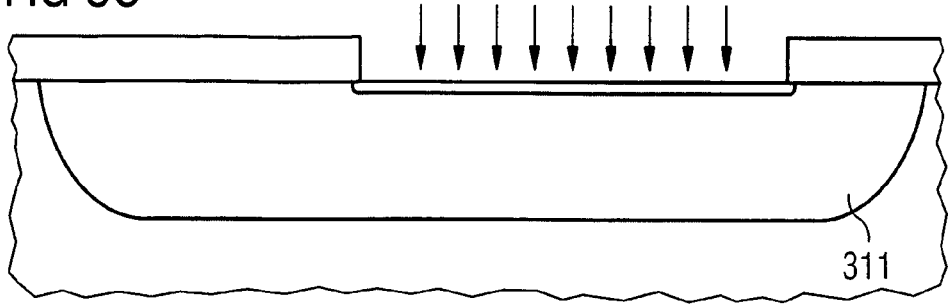
Figure 8D:
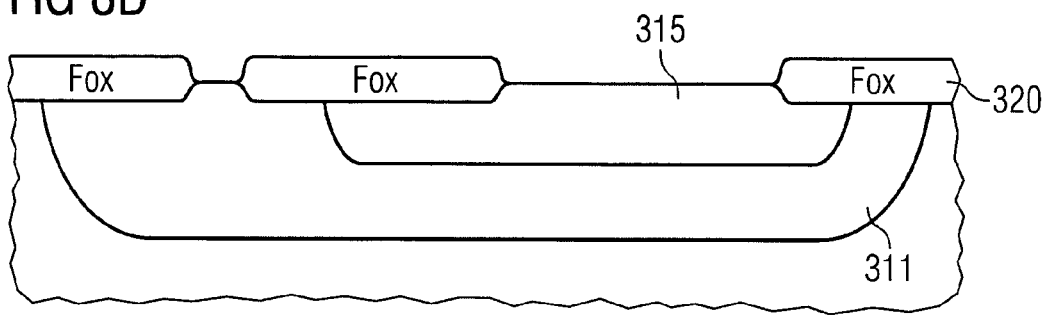
Figure 8E:
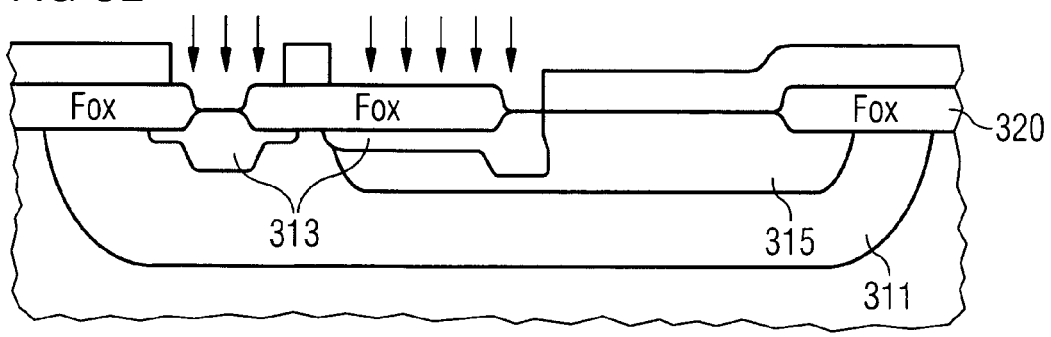
Figure 8F:
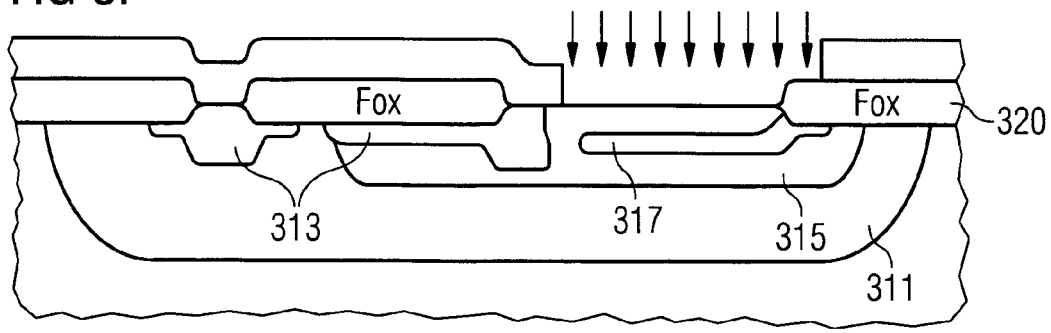

FIGS. 8A and 8B show the implantation and drive-in of the deep n-well 311 for the transistor shown in FIG. 7. Again, a resist mask with a pattern of openings is selected. It is also to be taken into consideration that shadowing takes place during the implantation due to the resist connecting pieces arranged above the doping region and the dosage to be set is adjusted higher accordingly than would be necessary for a mask with only one opening. FIGS. 8C and 8D show the implantation and drive-in of the deep p-well 315 and the corresponding field-oxide regions 320 produced in parallel. FIG. 8E shows the implantation for a shallow n-well 313 under the drain region 314 and also a drift region in the direction of the gate or N-channel. Field-oxide shadowing at corresponding positions leads to smaller penetration depth or lower implanted dosage. FIG. 8F shows the implantation for the shallow p-well 317 underneath the source.

FIG. 9 shows the doping profiles along the indicated sections of components, which have already been referenced together with FIGS. 1, 3, and 5.

Figure 10A:
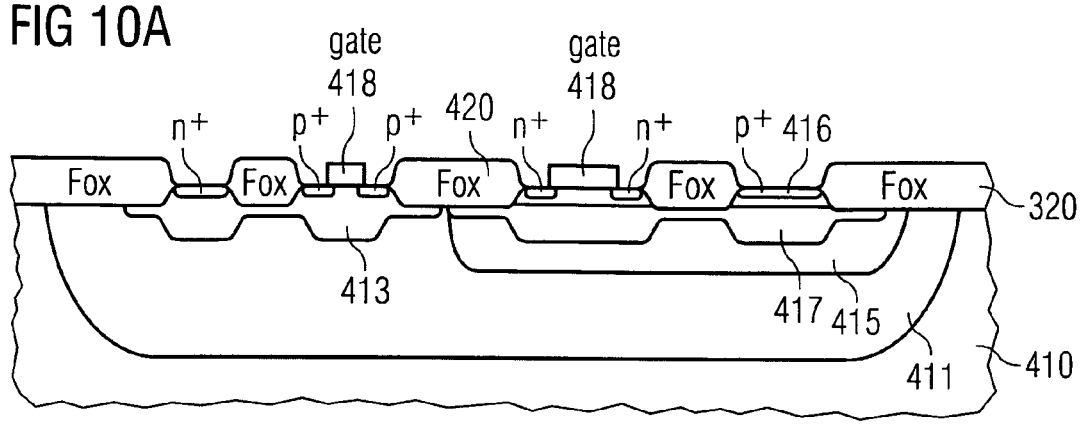
FIG. 10A shows a schematic cross section through a low-voltage transistor according to an embodiment of the invention.

FIG. 10 shows, using cutouts, in schematic cross section a low-voltage transistor (NV transistor), with wells that can be produced with the same processing steps as those of the described high-voltage transistors. The source and drain for the NV PMOS are embedded in the known n-wells 411 (DN) and 413 (SN). The source and drain for the NV NMOS are embedded in the shallow p-well 417 (SP) and this is in turn embedded in a deep p-well 415 (DP). The deep n-well 411 extends under the NV NMOS and NV PMOS and insulates the low-voltage transistor from the p-substrate. The gates 418 can be produced for NMOS and PMOS in the same processing step and thus at reduced expense. However, it is also possible to select different gate thicknesses for the two channels, so that separate processing steps are required. The gate oxides are not also shown in the figure.

Figure 11A:
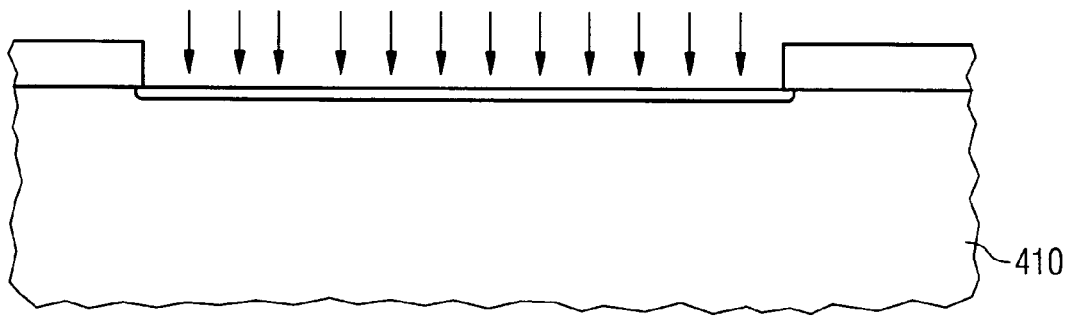
FIGS. 11A-11F show selected processing steps in the production of the low-voltage transistor of FIG. 1.
Figure 11B:
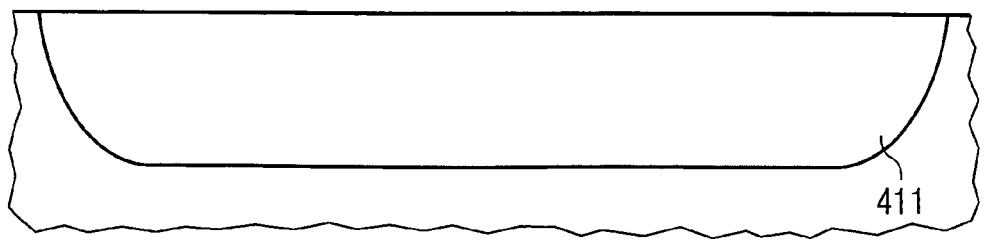
Figure 11C:
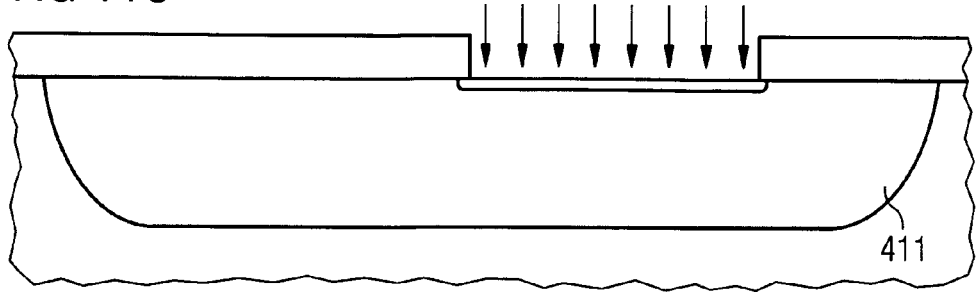
Figure 11D:
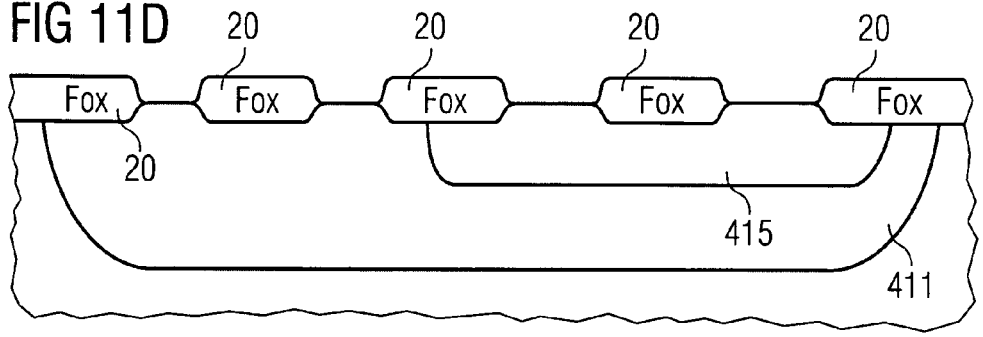
Figure 11E:
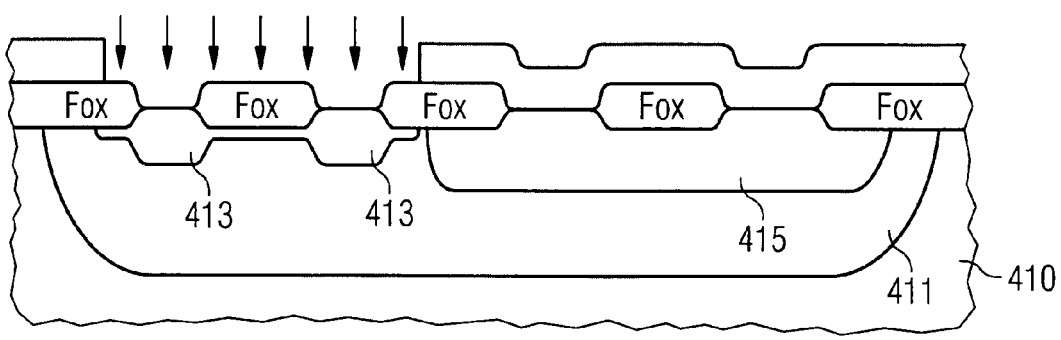
Figure 11F:
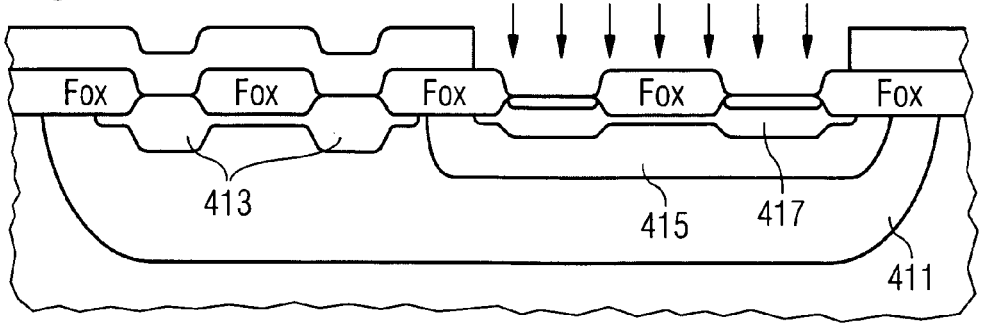

FIGS. 11A-11F show, using cutouts, selected processing steps in the production of the low-voltage transistor with reference to corresponding schematic sections through the transistor. FIG. 11A shows the implantation of the deep n-well 411, which is performed before the implantation and drive-in of all of the shallower wells. FIG. 11B shows the arrangement after the driving in of the doping and thus the complete deep n-well 411. Then according to FIG. 11C the implantation of the deep p-well 415 is performed under the entire NV NMOS. FIG. 11D shows the arrangement after the generation of field-oxide regions 20 (Fox) and after the driving in of the deep p-well 415. FIG. 11E shows the implantation of the shallow n-well 413, in which regions to be protected or not to be subjected to implantation are covered with a resist mask. FIG. 11F shows the corresponding implantation of the shallow p-well 417. Then the gates are generated above corresponding gate-oxide regions and the source and drain are implanted separately for the NV PMOS and NV NMOS (not shown in the figure).

Figure 12:
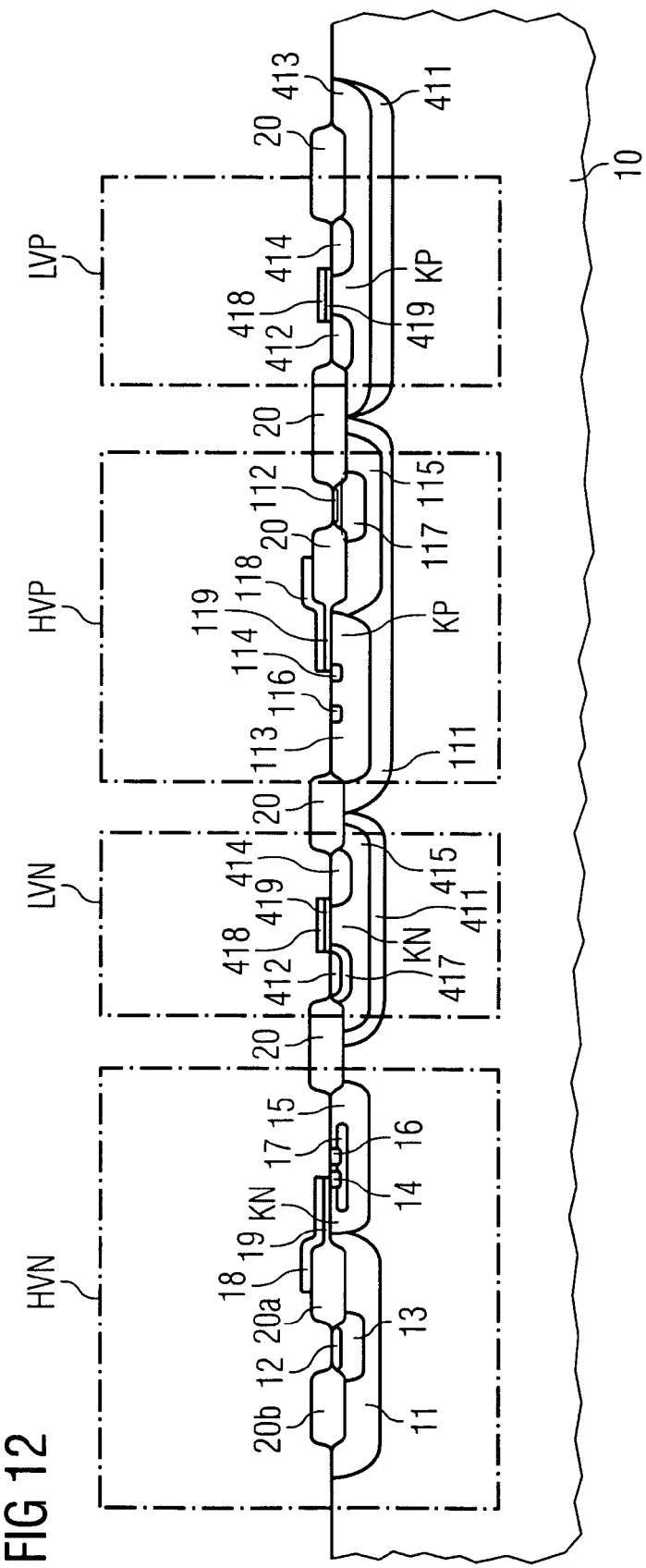
FIG. 12 shows a schematic cross section through a semiconductor substrate with two low-voltage transistors and two high-voltage transistors according to an embodiment of the invention.

FIG. 12 shows in a schematic way the configuration of a low-voltage transistor and a high-voltage transistor of the described type for different conductivity types. The n-channel high-voltage transistor described in FIG. 1 is designated HVN, while the p-channel high-voltage transistor described in FIG. 3 is designated HVP. The n-channel low-voltage transistor as LVN is arranged with drain 412, source 414, and gate 418 in a deep p-well 415 accordingly. In addition, a shallow p-well 417 is provided here. The channel regions are uniformly designated KN for the n-channel type and KP for the p-channel type.

The p-channel low-voltage transistor LVP is arranged in a deep n-well 411. A shallow n-well 413 is provided in the deep n-well 411 as the body in which the drain 412, source region 414, and gate 418 are arranged. The field-oxide regions are uniformly designated as 20.

As can be seen from the figures, the (average-depth) n-wells 21, 221, the deep n-wells 11, 111, 211, 311, 411, the shallow n-wells 13, 113, 313, and 413, the deep p-wells 15, 115, 315, and 415, and also the shallow p-wells 17 and 117 are each produced with the same processing steps of the low-voltage process. In this way, by means of corresponding masks, first the deep n-doped or p-doped wells are implanted and then the shallow n-doped or p-doped wells are implanted. Only then are the other structures of the semiconductor arrangement produced, such as field oxides and source or drain connections. Between a deep and a shallow well, the implantation of a (medium-depth) n-doped or p-doped well can also be realized, if this should be necessary for the later purpose of the application at very high operating voltages. The so-called reuse of the wells or their masks allows an extremely economical production process.

The n-well 413 regularly forms the channel region (body) for the low-voltage PMOS transistor and simultaneously the body 113 of the high-voltage PMOS transistor. Simultaneously, the n-well 13 or 213 and 221 for the field-strength reduction (drain engineering) is used underneath the drain 12 of the high-voltage NMOS transistor or 212 of the very high-voltage transistor.

The less doped deep n-well 11 or 111, 211 or 411 generally acts as an insulation element relative to the substrate 10 or 110 or 210. Simultaneously, the deep n-well 111 is used as insulation of the drift region 115 of the high-voltage PMOS transistor relative to the substrate or is used as a body of the high-voltage PMOS transistors. In the embodiment of FIG. 3, the deep n-well 211 is used as a drift region for the very high-voltage NMOS transistor.

The deep p-well 115 forms, together with the shallow p-well 117, the drift region of the high-voltage PMOS transistor from FIG. 2. Simultaneously, the deep p-well 15 or 215 is used as the channel region of the high-voltage NMOS transistor or the very high-voltage NMOS transistor (FIG. 1 or 5).

The shallow p-well 17 or 217 is used as a channel region of the high-voltage NMOS transistor or the very high-voltage NMOS transistor from FIGS. 1 and 3, respectively. The shallow p-well 117 is further used for reducing the field strength in the drain region for the high-voltage PMOS transistor. In addition, the shallow p-well 417 is used in the LVN as a channel stopper.

The described multifunctional use of the shown wells for different transistors forms a considerable advantage in terms of efficiency in the production of such high-voltage components by means of a low-voltage process. With only 4 wells, namely, a shallow and a deep n-well and a shallow and a deep p-well, both low-voltage and also high-voltage transistors can be produced simultaneously. In this way, a significant number of masks and lithography steps and thus processing costs can be saved relative to other production methods of such mixed components. Simultaneously, the high-voltage transistors and the low-voltage transistors can be optimized independently of each other. Also, in this way the silicon or substrate surface area can be economized, especially for the lateral high-voltage transistors, which is also cost-effective.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A high-voltage transistor comprising:
   a substrate with a source, a drain, and a gate electrode above a channel region formed between the source and the drain;
   a well of a first conductivity type arranged in the substrate, the substrate having a second conductivity type;
   a well of the second conductivity type located adjacent to the well of the first conductivity type;
   a drain diffusion of the first conductivity type located above the well of the first conductivity type;
   a source diffusion of the first conductivity type located above the well of the second conductivity type;
   a further well of the first conductivity type located between the drain diffusion and the well of the first conductivity type, the further well of the first conductivity type having a lower doping concentration than the drain diffusion and a higher doping concentration than the well of the first conductivity type; and
   a further well of the second conductivity type located between the source diffusion and the well of the second conductivity type, the further well of the second conductivity type having a higher doping concentration than the well of the second conductivity type.

2. The high-voltage transistor according to claim 1, wherein, for an n-channel type, a shallow n-well with a lower doping concentration than the drain is initially formed underneath the drain, the shallow n-well is formed in a deep n-well or an n-well, so that the doping concentration decreases in a lateral direction and toward the substrate, a shallow p-well with higher doping concentration than a deep p-well embedding the shallow p-well is provided underneath the source, and the deep p-well is more highly doped than the substrate.

3. The high-voltage transistor according to claim 2, wherein, underneath the shallow n-well, the n-well is initially provided and a deep n-well embedding the shallow n-well is subsequently provided so that the doping concentration essentially decreases with increasing depth to the substrate.

4. The high-voltage transistor according to claim 2, wherein the n-well lying deepest in the substrate forms insulation from the substrate and lies deeper than the deep p-well.

5. The high-voltage transistor according to claim 2, wherein the shallow n-well or shallow p-well is formed as a retrograde well through ion implantation.

6. The high-voltage transistor according to claim 1, wherein, for a p-channel type, a shallow p-well with a lower doping concentration than the drain is initially formed underneath the drain, the shallow p-well is formed in a deep p-well so that the doping concentration decreases with increasing depth to the substrate, and underneath the source, there is a shallow n-well with higher doping concentration than an n-well or deep n-well arranged underneath the shallow n-well.

7. The high-voltage transistor according to claim 1, wherein n-doping is realized through phosphorus or arsenic and p-doping is realized through boron.

8. The high-voltage transistor according to claim 1, wherein the doping concentration of the wells decreases in a lateral direction starting from the source or drain.

* * * * *